United States Patent
Ueda

(10) Patent No.: US 8,592,005 B2
(45) Date of Patent: Nov. 26, 2013

(54) ATOMIC LAYER DEPOSITION FOR CONTROLLING VERTICAL FILM GROWTH

(75) Inventor: Shintaro Ueda, Tama (JP)

(73) Assignee: ASM Japan K.K., Tokyo (JP)

( * ) Notice: Subject to any disclaimer, the term of this patent is extended or adjusted under 35 U.S.C. 154(b) by 276 days.

(21) Appl. No.: 13/094,402

(22) Filed: Apr. 26, 2011

(65) Prior Publication Data

US 2012/0276306 A1  Nov. 1, 2012

(51) Int. Cl.
| | | |
|---|---|---|
| H05H 1/24 | (2006.01) | |
| B05D 1/36 | (2006.01) | |
| B05D 3/00 | (2006.01) | |
| B05D 1/32 | (2006.01) | |
| B05D 5/00 | (2006.01) | |

(52) U.S. Cl.
USPC ............... 427/576; 427/255.18; 427/255.19; 427/255.21; 427/255.27; 427/255.7; 427/264; 427/265; 427/270; 427/271; 427/272; 427/282

(58) Field of Classification Search
None
See application file for complete search history.

(56) References Cited

U.S. PATENT DOCUMENTS

| | | | | |
|---|---|---|---|---|
| 5,013,691 A | * | 5/1991 | Lory et al. | 438/789 |
| 6,180,979 B1 | * | 1/2001 | Hofmann et al. | 257/329 |
| 6,218,288 B1 | * | 4/2001 | Li et al. | 438/627 |
| 7,923,382 B2 | * | 4/2011 | Huotari et al. | 438/785 |
| 2003/0003635 A1 | * | 1/2003 | Paranjpe et al. | 438/149 |
| 2004/0134429 A1 | * | 7/2004 | Yamanaka et al. | 118/723 E |
| 2006/0240662 A1 | * | 10/2006 | Conley et al. | 438/625 |
| 2012/0052681 A1 | * | 3/2012 | Marsh | 438/680 |

OTHER PUBLICATIONS

K.Morishige, S.Kittaka, S.Katsuragi, T.Morimoto; "Thermal desorption and infrared studies of ammonia amines and pyridines chemisorbed on chromic oxide", J.Chem.Soc., Faraday Trans.1, 78, 2947-2957, (1982).
N.W.Cant, L.H.Little: Chemisorption sites on porous silica glass and on mixed-oxide catalysis, Can.J.Chem, 46,1373, (1968).

* cited by examiner

*Primary Examiner* — Timothy Meeks
*Assistant Examiner* — Mandy Louie
(74) *Attorney, Agent, or Firm* — Snell & Wilmer L.L.P.

(57) ABSTRACT

A method for forming a film by atomic layer deposition wherein vertical growth of a film is controlled, includes: (i) adsorbing a metal-containing precursor for film formation on a concave or convex surface pattern of a substrate; (ii) oxidizing the adsorbed precursor to form a metal oxide sub-layer; (iii) adsorbing a metal-free inhibitor on the metal oxide sub-layer more on a top/bottom portion than on side walls of the concave or convex surface pattern; and (iv) repeating steps (i) to (iii) to form a film constituted by multiple metal oxide sub-layers while controlling vertical growth of the film by step (iii). The adsorption of the inhibitor is antagonistic to next adsorption of the precursor on the metal oxide sub-layer.

12 Claims, 6 Drawing Sheets

ATOMIC LAYER DEPOSITION FOR CONTROLLING VERTICAL FILM GROWTH

BACKGROUND

1. Field of the Invention

The present invention generally relates to atomic layer deposition (ALD) technology, particularly to a method for forming a film by ALD which controls film growth in a vertical direction.

2. Description of the Related Art

Basically, Atomic Layer Deposition (ALD) is implemented by repeating a process of oxidizing, by means of plasma decomposition reaction or thermal reaction in an oxygen atmosphere, a material adsorbed onto a substrate. This ALD is largely classified into two types based on the oxidization method. To be specific, the type of ALD that uses plasma decomposition reaction of oxygen is called "Plasma Enhanced ALD (PE-ALD)," while the other type of ALD that uses thermal reaction in an oxygen ambience is called "Thermal ALD."

In ALD, a film grows more gradually than when PE-CVD is used. However, ALD is characterized in that, because the material which has been adsorbed onto the substrate as an atomic layer is oxidized without fail, the carbon content originating from the material is kept to a minimum even when the film forming temperature is low and that the resulting amorphous film also contains fewer methyl groups, hydoroxy groups, hydrogen and other terminal groups originating from the material. In addition, ALD is characterized in that, by use of the saturated adsorption of the material, an in-plane uniformity of less than 1% and step coverage of 100% can be achieved easily.

If this ALD is applied to a gap filling, side wall spacer or spacer-defined double patterning (SDDP), however, the 100% step coverage will present problems, although such application is very effective in terms of film quality and in-plane uniformity.

Take a gap filling, for example. ALD will present the above problems when patterns of different pitches are buried uniformly. If wide-pitch patterns are buried by means of ALD until their surface becomes flat, excessive film will deposit on top of narrow-pitch patterns. For this reason, chemical & mechanical polishing (CMP) or dry etching must be implemented in a subsequent process to remove the film deposited on top. The same applies to side wall spacer and SDDP, where the film on top that has grown as thick as the film on side walls must be removed by CMP or dry etching. To eliminate this subsequent process of CMP or dry etching, a film growth in a vertical direction must be controlled.

As for PE-CVD, a technology for film growth in a selected direction, which is called "Flowable CVD," is available, but no such direction-selective film growth technology is available in the case of ALD. To widen the scope of application of ALD, development of direction-selective film growth technology is desired.

Any discussion of problems and solutions involved in the related art has been included in this disclosure solely for the purposes of providing a context for the present invention, and should not be taken as an admission that any or all of the discussion were known at the time the invention was made.

SUMMARY

In an embodiment, the present invention is characterized in that the growth of an oxide film in a longitudinal direction (vertical direction or height direction) is suppressed to achieve specialization of growth of oxide film in a transverse direction (horizontal direction) (thereby virtually promoting selective, relative growth in a horizontal direction). This embodiment is hereinafter referred to as "Transverse ALD" or "Vertical Growth-Suppressed ALD."

In some embodiments, a method for forming a film by atomic layer deposition is provided wherein vertical growth of a film is selectively inhibited more than horizontal growth of the film, which method comprises: (i) adsorbing a metal-containing precursor for film formation on a concave or convex surface pattern of a substrate; (ii) oxidizing the adsorbed precursor to form a metal oxide sub-layer; (iii) adsorbing a metal-free inhibitor on the metal oxide sub-layer more on a top/bottom portion than on side walls of the concave or convex surface pattern, said adsorption of the inhibitor being antagonistic to the next adsorption of the precursor on the metal oxide sub-layer; and (iv) repeating steps (i) to (iii) to form a film constituted by multiple metal oxide sub-layers while selectively inhibiting vertical growth of the film by step (iii) more than horizontal growth of the film.

In some embodiments, the vertical growth of the film is substantially less than the horizontal growth of the film.

In some embodiments, the metal-containing precursor comprises silicon, nitrogen, hydrogen, and carbon. In some embodiments, the metal-containing precursor is a silicon-containing amine. In some embodiments, the metal oxide sub-layer is constituted by SiO or SiOC.

In some embodiments, the metal-free inhibitor comprises nitrogen and hydrogen. In some embodiments, the metal-free inhibitor is ammonia or pyridine.

In some embodiments, step (iii) comprises supplying a metal-free inhibitor gas over the substrate, and applying RF power to the inhibitor gas to generate radicals therefrom which deposit more in a vertical direction than in a horizontal direction, thereby adsorbing the inhibitor on the metal oxide sub-layer more on a top/bottom portion than on side walls.

In some embodiments, step (ii) comprises supplying oxygen over the substrate, and applying RF power to the oxygen to generate an oxygen plasma, thereby oxidizing the adsorbed precursor.

In some embodiments, the film has a conformity of 120% or higher. In some embodiments, step (iii) comprises supplying a metal-free inhibitor gas over the substrate, and applying RF power to the inhibitor gas to generate radicals therefrom, thereby adsorbing the inhibitor on the metal oxide sub-layer, wherein the RF power in step (iii) is greater than the RF power in step (ii). In some embodiments, in step (iii), a reverse bias or low frequency waves is/are applied on the substrate to direct the movement of radicals more in a vertical direction than in a horizontal direction.

In some embodiments, step (i) comprises supplying a metal-containing precursor gas over the substrate in a pulse of about 0.1 to about 3.0 seconds, step (ii) comprises applying RF power in the presence of oxygen over the substrate in a pulse of about 0.1 to about 5.0 seconds, and step (iii) comprises supplying a metal-free inhibitor over the substrate in a pulse of about 2 to about 2.5 seconds with RF power application in a pulse of about 0.1 to about 5.0 seconds, wherein steps (i) to (iii) are separated by purging.

In some embodiments, the concave or convex surface pattern is constituted by trenches.

In another aspect, some embodiments provide a method for geometrically controlling film growth by atomic layer deposition, comprising: (i) providing a substrate having a metal oxide film formed on its surface; (ii) adsorbing a metal-free inhibitor more on a target location of the surface where film growth is to be inhibited than on other locations of the surface;

(iii) adsorbing a metal-containing precursor for film formation on the surface, said adsorption of the inhibitor being antagonistic to the adsorption of the precursor on the surface; (iv) oxidizing the adsorbed precursor to form a metal oxide sub-layer; and (v) repeating steps (ii) to (iv) to form a film while selectively inhibiting growth of the film by step (ii) on the target location more than that on the other locations of the surface.

In some embodiments, the surface has a concave or convex pattern, and the target location is a top/bottom portion of the concave or convex pattern.

In all of the aforesaid embodiments, any element used in an embodiment can interchangeably or additionally be used in another embodiment unless such a replacement is not feasible or causes adverse effect. Further, the present invention can equally be applied to methods, apparatuses, and films.

If this transverse ALD is applied to a gap filling, the film growth can be suppressed in the same longitudinal direction in all trenches even when both shallow trenches (narrow trenches) and wide-pitch trenches are buried on a flat surface, which allows for suppression of film deposition or virtually non-deposition of film even on top of shallow trenches. In other words, the film growth rate in a longitudinal direction can be selectively and virtually reduced with respect to the film growth ratio in a transverse direction. As a result, CMP or dry etching in a subsequent process can be reduced or eliminated.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION

In this disclosure, a "vertical direction", "horizontal direction", "height direction", "thickness direction", "transverse direction", etc. refer to a direction generally or substantially in that direction, and these directions are relative to a reference direction. In this disclosure, "gas" may include vaporized solid and/or liquid and may be constituted by a mixture of gases. In this disclosure, the precursor gas, the oxidizing gas, the inhibitor gas, and the additive gas (inert gas, rare gas, carrier gas, seal gas, or other nonreactive gas) may be different from each other or mutually exclusive in terms of gas types, i.e., there is no overlap of gas types among these categories. Gases can be supplied in sequence with or without overlap. Further, in this disclosure, any two numbers of a variable can constitute an applicable range of the variable, and any ranges indicated may include or exclude the endpoints. A "film" may refer to a layer continuously extending in a direction perpendicular to a thickness direction substantially without pinholes to cover an entire target or concerned surface, or simply a layer covering a target or concerned surface. A "layer" may refer to a structure having a certain thickness formed on a surface or a synonym of film. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. A "sub-layer" refers to a layer formed by one cycle of an ALD process. In the disclosure, "substantially smaller", "substantially different", "substantially less" or the like may refer to a difference recognized by a skilled artisan in view of the disclosure, such as a difference of at least 1%, 5%, 10%, 20%, 30%, 40%, 50%, 60%, 70%, 80%, or any ranges thereof in some embodiments. Also, in the disclosure, "substantially the same", "substantially uniform", or the like may refer to a difference recognized by a skilled artisan in view of the disclosure, such as a difference of less than 10%, less than 5%, less than 1%, or any ranges thereof in some embodiments. In this disclosure, any defined meanings do not necessarily exclude ordinary and customary meanings in some embodiments.

In the present disclosure where conditions and/or structures are not specified, the skilled artisan in the art can readily provide such conditions and/or structures, in view of the present disclosure, as a matter of routine experimentation.

The disclosed embodiments will be described with reference to drawings. However, the disclosed embodiments are not intended to limit the present invention.

Figure 1:
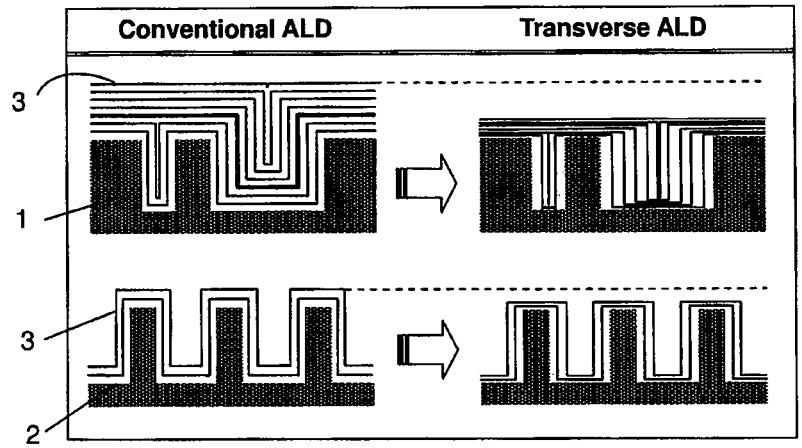
FIG. 1 is a schematic view illustrating film growth control by conventional ALD (left) and transverse ALD (right) on a concave pattern (upper) and a convex pattern (lower).

FIG. 1 is a schematic illustration of the characteristics of transverse ALD in an embodiment. Take note that, while the film thickness is exaggerated in FIG. 1, the continuous films each depicted as a single layer actually represent a single layer obtained by a specific number of ALD cycles. Compared to the example of conventional ALD (where the conformality is approx. 100%) shown on the left, the growth ratio of film 3 in a transverse direction in the example of transverse ALD on the right is virtually or roughly the same as that under conventional ALD, but the growth ratio of film 3 in a longitudinal direction is virtually or significantly suppressed compared to that under conventional ALD. The same control is possible in both concave pattern 1 (top) and convex pattern 2. Additionally under transverse ALD, a desired film thickness can be achieved in a transverse direction, in addition to the film thickness in a longitudinal direction being reduced, which makes transverse ALD very effective for side wall spacer and SDDP in that, because film growth in a transverse direction is also controlled in addition to the film growth in a longitudinal direction, CMP or dry etching in a subsequent process can be reduced or eliminated.

ALD is a film growth process by use of the chemisorption of precursor material and therefore, to form an oxide that will constitute an ALD film, a precursor material that can be chemisorbed onto the oxide film of the precursor, as obtained as a result of oxidization, is selected. For example, silanediamine,N,N,N',N'-tetraethyl having two tertiary amines in the molecule is already known as an effective material for ALD.

The present invention that suppresses the film growth in a longitudinal direction is also a film growth process that uses the ALD method, or chemisorption, and therefore the known precursor material mentioned above can be used in an embodiment of the present invention. Under a more orthodox embodiment of the present invention, however, chemisorption in a longitudinal direction is inhibited and suppressed in order to suppress the film growth in a longitudinal direction. In an embodiment, to inhibit and suppress chemisorption in a longitudinal direction, an inhibitor that inhibits chemisorption between the precursor material and oxide film of the precursor, such as an inhibitor material having in its molecule N and H that are antagonistic to adsorption of the precursor material having at least one of primary, secondary and tertiary amines in its molecule, is used for controlling the film growth in a longitudinal direction while the oxide film formation process is implemented. In an embodiment, any chemical compound can be used without limitation as long as it can serve as an inhibitor material that virtually inhibits chemisorption between the precursor material and oxide film of the precursor. For example, amine and ammonia are known to chemisorb to the surface of chromium oxide film, etc. (for example, refer to the following: K. Morishige, S. Kittaka, S. Katsuragi, T. Morimoto; "Thermal desorption and infrared studies of ammonia amines and pyridines chemisorbed on chromic oxide", J. Chem. Soc., Faraday Trans. 1, 78, 2947-2957, (1982);] N. W. Cant, L. H. Little: Chemisorption sites on porous silica glass and on mixed-oxide catalysis, Can. J. Chem, 46, 1373, (1968)).

In an embodiment, the inhibitor material adsorbs to the oxide film of the precursor before the precursor material does, thereby virtually inhibiting the precursor material from adsorbing to the oxide film of the precursor. In an embodiment, the inhibitor material replaces the hydroxy groups present on the surface of precursor oxide film and then adsorbs to the surface of this oxide film, thereby virtually inhibiting the precursor material from adsorbing to the hydroxy groups. In an embodiment of the invention in which the film growth in a longitudinal direction is suppressed, a precursor material used for forming an ALD oxide can be any one or a combination of two or more known or other appropriate materials. For example, a Si-containing amine compound is used in an embodiment. In an embodiment, the precursor material is not limited to an amine containing only one type of metal element in its molecule, but an amine that contains multiple metal elements (such as B, Ge, As, Ti, Co, Ta, etc.) can also be used as the material. In an embodiment, the ratio of film thickness on side and film thickness on top (S/T) (also referred to as "Conformality") is controlled within a range of approximately 1.1 to approximately 10, or within a range of approximately 1.5 to approximately 4, by means of control of the film growth in a longitudinal direction. In an embodiment, the film growth in a transverse direction is virtually not suppressed or suppressed only to a limited extent, while the film growth in a longitudinal direction is selectively controlled by more than the film growth in a transverse direction.

As for the oxide film obtained through oxidization of the precursor, typical examples include SiO film and SiOC film when the precursor contains Si. However, the choice is not at all limited to the foregoing.

Figure 2:
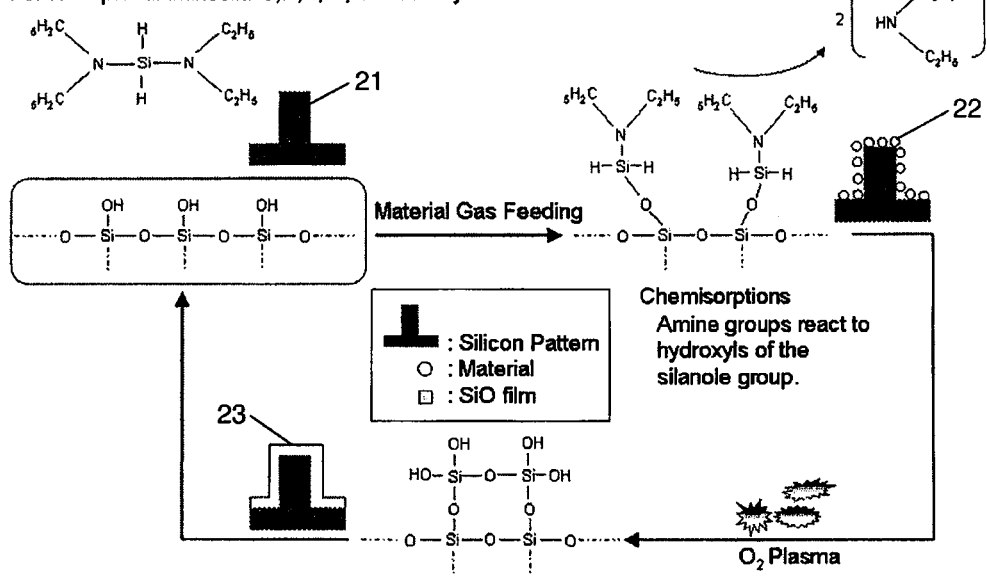
FIG. 2 is a schematic illustration of ALD cycles.

The reaction mechanism of PE-ALD applicable in an embodiment of the present invention is shown in FIG. 2. The mechanism of chemisorption between the precursor material (hereinafter also referred to simply as "Material") which is amine (silanediamine,N,N,N',N'-tetraethyl) in this example, and oxide film of the precursor (hereinafter also referred to simply as "Oxide Film") is not necessarily clear. Although the present invention is not limited in theory in any way by the following explanation, it is assumed that unpaired electrons of amine in the material strip off hydrogen from the hydroxy groups bonded with the oxide film, thereby dissociating themselves from the material molecule and allowing Si, whose electric charges are now uneven due to the dissociation of amine, to bond with Si on the substrate (Si in the oxide film) via oxygen. In other words, the precursor is supplied to silicon pattern 21 and virtually saturated on the surface, and a mechanism like the one mentioned above is used to cause the saturated precursor to be chemisorbed onto the pattern. The chemisorbed precursor molecules 22 are oxidized by oxygen plasma and a SiO film 23 is formed on the pattern. This SiO film has hydroxy groups on its surface and when the precursor is supplied onto the pattern again, chemisorption occurs again according to the aforementioned mechanism, and as this cycle is repeated, ALD film is deposited continuously.

In an embodiment of the present invention, the aforementioned chemisorption of the precursor onto the pattern surface is isotropically inhibited to suppress the film growth in a longitudinal direction. To be specific, ammonia, pyridine, any amino compound not containing metal element or other appropriate inhibitor is caused to bond with the hydroxy groups on the surface of oxide film in such a way that an inhibitor bonds with the hydroxy groups on the horizontal plane of the pattern more than those on the side wall, in order to inhibit chemisorption of the material gas and thereby suppress the growth of the oxide film in a longitudinal direction. Note that, by causing an inhibitor to bond in advance with an area of the pattern where suppression of film growth is desired, as explained above, the film growth can be suppressed geographically in any desired location, not just in a longitudinal direction.

Figure 3:
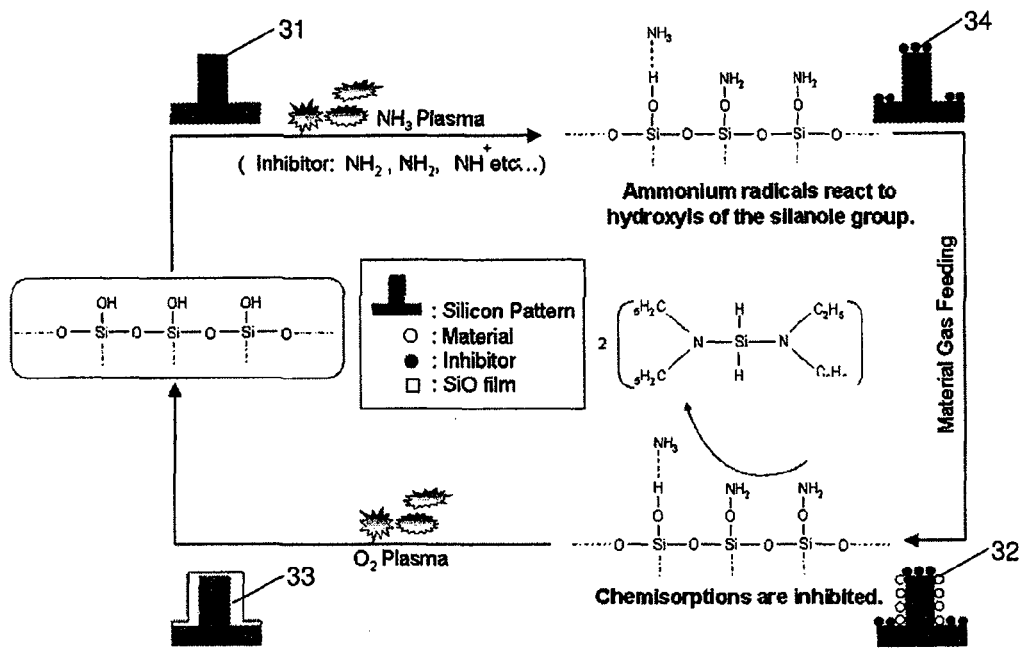
FIG. 3 is a schematic illustration of ALD cycles with a precursor chemisorption-inhibiting mechanism according to an embodiment of the present invention.

The inhibition mechanism of precursor adsorption in an embodiment is shown in FIG. 3. Here, an inhibitor such as ammonia is supplied onto pattern 31 and virtually saturated on the surface, so that it is adsorbed onto the surface in advance. Formed on this surface is an oxide film; any substance can be used as an inhibitor as long as it is chemisorbed onto this oxide film and becomes antagonistic to adsorption of precursor without virtually forming any film. However, an appropriate inhibitor is selected as deemed appropriate by considering its stability, ease of use, degree of antagonism to the precursor, and so on. In this figure, the inhibitor molecules 34 adsorbed onto the surface are selectively adsorbed onto the top surface and bottom surface of the pattern (by means of diffusion in a gravitational direction, for example). Precursor gas is then supplied on top and virtually saturated on the surface so that it is chemisorbed onto the surface. At this time, adsorption of the precursor is inhibited by the presence of inhibitor molecules already adsorbed onto the surface. As a result, the density of adsorbed precursor molecules 32 becomes lower on the top surface and bottom surface where more inhibitor is present, while the density becomes higher on the side walls where less inhibitor is present. When the pattern surface is oxidized by oxygen plasma in this condition, the oxide film 33 obtained by said oxidization becomes thin on the top surface and bottom surface, while it becomes thick on the side walls.

Also note that, since these inhibitors exhibit high inhibition effect when converted to the radical form, in an embodiment the reaction of oxide and inhibitor is implemented in the presence of plasma, as a rule.

Ammonia or any amino chemical containing no metal element is used for the inhibitor. Note that, in an embodiment, a radical species generated by plasma decomposition of amine or ammonia is used for the purpose of inhibition, and accordingly a similar effect can be achieved when these component atoms or molecules are mixed in the presence of plasma, which means that potential inhibitors also include mixed gases that may generate radical species in the presence of plasma just as amine and ammonia do. Examples of these mixed gases include, among others, a mixed gas of $N_2$ and $H_2$ (such as one where $N_2$ and $H_2$ are mixed at a ratio of approx. 1/1 to approx. 1/10, or preferably at a ratio of approx. 1/1 to approx. 1/3).

Figure 4:
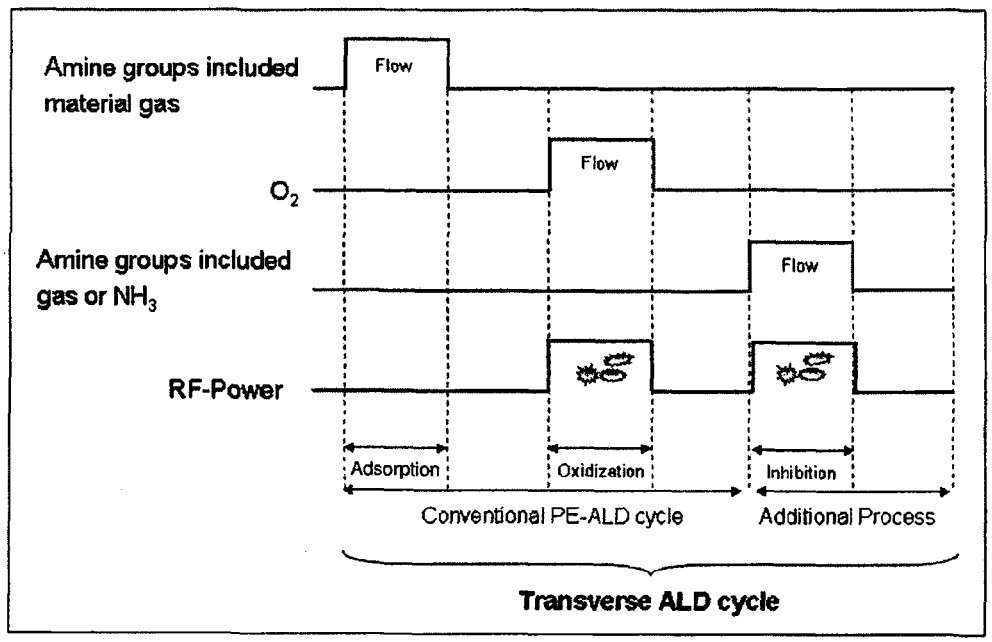
FIG. 4 illustrates a sequence of transverse ALD according to an embodiment of the present invention.

In an embodiment, transverse ALD is used by incorporating this inhibition process in the second half of the repeated PE-ALD process (i.e., in the second half of one cycle), or the inhibition process (Inhibition pulse) can also be incorporated into the first half of the repeated process in an embodiment. As far as the stages constituting this repetition cycle are concerned, therefore, "Oxidization stage→Inhibition stage" can also be interpreted as "Inhibition stage→Oxidization stage." When it comes to chemisorption of an inhibitor, the inhibitor can demonstrate its antagonistic action with respect to the precursor by adsorbing to the surface, as long as this adsorption of the inhibitor occurs before the precursor is chemisorbed. The sequence of transverse ALD in an embodiment is shown in FIG. 4. The stages—the precursor adsorption pulse, purge pulse, oxidization pulse, purge pulse, inhibitor adsorption pulse and purge pulse—constitute one cycle where a sub-layer is formed, and this cycle is repeated to form a desired ALD film. The sequences—the precursor adsorption pulse, purge pulse, oxidization pulse and purge pulse—represent the conventional ALD sequence, while in transverse ALD the inhibitor adsorption pulse and purge pulse are implemented further in the same cycle. Note that, while inhibitor adsorption typically is implemented once every cycle, it can also be implemented intermittently (such as once every two or three cycles). In this case, however, naturally the degree of suppression of film growth is reduced. In the embodiment shown in FIG. 4, oxidization is implemented by means of oxygen plasma, while inhibitor adsorption is implemented using plasma of the inhibitor (hydrogen+nitrogen plasma). Also note that the oxidization pulse can overlap with the precursor pulse (as long as it does not overlap with the inhibitor pulse). Furthermore, the oxygen supply pulse and RF application pulse may be the same pulse, or different pulses as long as oxygen is present when RF is applied. In addition, the inhibitor supply pulse and RF application pulse may be the same pulse, or different pulses as long as the inhibitor is present when RF is applied. Provided that doing so stabilizes the flow rate of pulse introduction gas, the inhibitor gas pulse and RF application pulse may be the same pulse. In reality, however, in an embodiment there is a difference between the start of gas pulse and that of RF application pulse because it takes some time until the flow rate of pulse introduction gas stabilizes.

In other embodiment, the inhibition pulse can be incorporated into the second half of the repeated Thermal ALD process to achieve a similar effect.

The effect of inhibiting the film growth in a longitudinal direction increases as the RF application time of inhibition pulse is increased or RF power is increased. Furthermore, the greater the RF power, the more quickly a high inhibition effect is achieved. As for the direction of inhibition, it depends on the direction in which the inhibitor-originating radical species generated from plasma decomposition of the inhibitor are scattered. Under typical conditions used in normal settings, the dominant scattering direction of inhibitor-originating radical species is vertical (i.e., gravitational direction or direction between the top and bottom electrodes), and therefore the effect of inhibiting the film growth in a longitudinal direction becomes significantly greater than the effect of inhibiting the film growth in a transverse direction, thereby allowing for selective reduction of the film growth in a longitudinal direction. In other words, the direction of inhibition can be controlled more strictly by applying (such as 1 to 700 W) a reverse bias (such as 1 to 200 V) or low frequency (such as 400 to 600 kHz) to the substrate by means of inhibition pulse and thereby controlling the radical species to be scattered in a longitudinal direction. In addition, it is possible to control the film growths in longitudinal and transverse directions at the same time. In an embodiment, the direction of inhibition is controlled under conditions corresponding to the CVD film formation conditions where overhang tends to occur as a result of pattern film formation. For example, lowering the chamber pressure and raising the RF power tend to cause overhang. In an embodiment, the inhibition pulse conditions shown below may be used. Note that, even though the inhibition pulse is implemented, the oxide film does not become SiN (it is not nitrided) and the film is virtually not formed. In an embodiment, approximately 0.033 to approximately 0.0533 nm of film is formed in a transverse direction in one cycle, so the cycle is repeated by approximately 566 to 909 times until a desired film thickness (such as approx. 30 nm) is obtained.

The inhibition pulse conditions used during the ALD cycle in an embodiment (300-mm wafer; values are approximate) are shown in Table 1.

TABLE 1

|  | Typical condition | Desired condition |
| --- | --- | --- |
| Type of inhibitor gas | NH3, N2 + H2, C5H5N | NH3 |
| Flow rate of inhibitor gas (slpm) | 2.0 | 1.3 |

TABLE 1-continued

|  | Typical condition | Desired condition |
| --- | --- | --- |
| Length of inhibitor gas pulse (sec) | 2-2.5 | 2 |
| Applied RF frequency (MHz) | 13.56 | 13.56 |
| Applied RF power (W) | 40-800 | 40 |
| RF application time (sec) | 0.1-5.0 | 1.0 |
| Temperature (° C.) | 100-400 | 100 |
| Pressure (Pa) | 50-200 | 100 |
| Inhibitor gas purge (sec) | 0.3-2 | 0.5 |

The inhibitor gas pulse and RF application pulse may be virtually the same, but in an embodiment, the inhibitor gas pulse is started first and, when approximately 10% to approximately 50% (or approx. 20% to approx. 30%) of this pulse is left, application of RF is started.

In an embodiment, the RF power applied to the inhibitor gas is greater than, or specifically approximately 1.5 times to approximately 15 times (or approx. twice to approx. 10 times), for example, the RF power applied to the precursor pulse. Also in an embodiment, the RF application time with respect to the inhibition gas is longer than, or specifically approximately 1.5 times to approximately 5 times (or approx. twice to approx. three times), for example, the RF application time with respect to the precursor pulse. In an embodiment, the above RF power and the application time are combined.

Other conditions in an embodiment include those shown below. The precursor gas pulse conditions used during the ALD cycle in an embodiment (300-mm wafer; values are approximate) are shown in Table 2.

TABLE 2

|  | Typical condition | Desired condition |
| --- | --- | --- |
| Type of precursor gas | Silanediamine N,N,N',N'-tetraethyl, [(CH$_3$CH$_2$)$_2$N]$_2$SiH$_2$; Silanemonoamine N,N-diethyl, [(CH$_3$CH$_2$)$_2$N]SiH$_3$; (CH$_3$CH$_2$N)$_2$BH; (CH$_3$CH$_2$N)$_2$PH; [(CH$_3$CH$_2$)$_2$N]$_2$Ti H$_2$; [(CH$_3$CH$_2$)$_2$N]Ti H$_3$; [(CH$_3$CH$_2$)$_2$N]$_2$CoH$_2$; [(CH$_3$CH$_2$)$_2$N]Co H$_3$ Etc. | Silanediamine N,N,N',N'-tetraethyl, [(CH$_3$CH$_2$)$_2$N]$_2$SiH$_2$; Silanemonoamine N,N-diethyl, [(CH$_3$CH$_2$)$_2$N]SiH$_3$ |
| Flow rate of precursor gas (slpm) (total) | 1-2 | 1.3 |
| Flow rate of carrier gas (rare gas) (slpm) | 0.1-2.0 | 0.5 |
| Lateral pressure of precursor gas reactor (kPa) | 50-200 | 100 |
| Length of precursor gas pulse (sec) | 0.1-3.0 | 1.0 |
| Temperature (° C.) | 100-400 | 100 |
| Pressure (Pa) | 50-200 | 100 |
| Purge of precursor gas (sec) | 0.5-2.5 | 2.0 |

The oxidization pulse conditions used during the ALD cycle in an embodiment (300-mm wafer; values are approximate) are shown in Table 3.

TABLE 3

|  | Typical condition | Desired condition |
| --- | --- | --- |
| Type of oxidizing gas | O$_2$, NO$_2$ | O$_2$ |
| Flow rate of oxidizing gas (sccm) | 100-1000 | 400 |
| Length of oxidizing gas pulse (sec), or continuous pulse except for inhibition pulse | 0.1-1 | 0.3 |
| Applied RF frequency (MHz) | 13.56 | 13.56 |
| Applied RF power (W) | 15-800 | 40 |
| RF application time (sec) | 0.1-5.0 | 1.0 |
| Temperature (° C.) | 100-400 | 100 |
| Pressure (Pa) | 50-200 | 100 |
| Purge of oxidizing gas (sec) | 0.3-2.5 | 2.0 |

The pulse conditions (continuous) used during the ALD cycle in an embodiment (300-mm wafer; values are approximate) are shown in Table 4.

TABLE 4

|  | Typical condition | Desired condition |
| --- | --- | --- |
| Type of purge gas | Ar, He, NO$_2$, O$_2$, NH$_3$ | Ar |
| Flow rate of purge gas (slpm) | 200-2.5 | 2.0 |

In addition to the above, the distance between electrodes is approximately 10 to approximately 30 mm (or preferably approx. 12 to approx. 16 mm) in an embodiment.

The present invention will be explained in detail with reference to specific examples which are not intended to limit the present invention. The numbers applied in specific examples may be modified by a range of at least ±50%, wherein the endpoints of the ranges may be included or excluded.

Demonstration Experiments

An application example of transverse ALD where NH$_3$ is used as the inhibitor is shown for gap filling, side wall spacer and SDDP. The added values of transverse ALD, as revealed by the wet etching evaluation, are also shown. NH$_3$ was selected for these demonstration experiments because NH$_3$ exhibits the highest reactivity among inhibitors. Silanediamine N,N,N',N'-tetraethyl was used for the material gas, partly because this material is an amine-containing metal compound conforming to the present application for patent, and partly because its use in the generation of oxide film under PE-ALD is proven and this material is available in ample quantities in the market.

1) Gap Filling

Gap filling was performed at 100° C. using a CVD chamber (although a CVD apparatus modified to supply material gas was used here, any apparatus can be used as long as it is an ALD apparatus) by keeping the material supply line at 45° C. and material bottle at 35° C. to shorten the process. Burying characteristics were evaluated using a silicon pattern having trenches of approximately 100 nm and 240 nm in openings. Accordingly, the target film thickness was set to 145 nm by adding a 20% margin to the film thickness of 120 nm at which trenches of 240 nm in openings would be fully buried. Conventional ALD was implemented by repeating an oxidization process of irradiating oxygen plasma, which was generated at an RF power of 40 W, for 1 second onto the material adsorbed onto the substrate. On the other hand, transverse ALD was implemented by adding to the second half of the same oxide film formation process to be repeated as under conventional ALD a process of suppressing the film growth in a longitudinal direction using HN$_3$ plasma. So that the effect of suppressing the film growth would manifest more clearly, the RF power was set slightly higher to 400 W, while the RF application time was also set slightly longer to 1 second, for the irradiation of NH$_3$ plasma. The film formation conditions of conventional ALD are shown in Table 5, while the film formation conditions of transverse ALD are shown in Table 6.

TABLE 5

| Step | Time [sec] | RF-Power [W] | NH3 [slpm] | O2 [sccm] | BTL-Ar [slpm] | APR-Ar [kPa] | Ar [sccm] | Seal He [sccm] |
|---|---|---|---|---|---|---|---|---|
| Precursor Pulse | 1.0 | | | | 2 (1.2) | 30 | | |
| Precursor Purge | 0.3 | | | 400 | | | 200 | 200 |
| RF Pulse | 1.0 | 40 | | | | | | |
| RF Purge | 0.5 | | | | | | | |

Susceptor, Wall, Shower Head: 100, 100, 100 [deg C.]
Pressure: 91-109 [Pa]
Gap Length: 25 [mm]
145 nm Target: 1511 [cycle]
Source Bottle, Feeding Line: 35, 45 deg C.

TABLE 6

| Step | Time [sec] | RF-Power [W] | NH3 [slpm] | O2 [sccm] | BTL-Ar [slpm] | APR-Ar [kPa] | Ar [sccm] | Seal He [sccm] |
|---|---|---|---|---|---|---|---|---|
| Precursor Pulse | 1.0 | | | | 2 (1.2) | 30 | | |
| Precursor Purge | 0.3 | | | 400 | | | | |
| RF Pulse | 1.0 | 40 | | | | | | |
| RF Purge | 0.5 | | | | | | 200 | 200 |
| Change | 3.0 | | 2 | | | | | |
| RF Pulse | 1.0 | 400 | | | | | | |
| RF Purge | 1.0 | | | 400 | | | | |

Susceptor, Wall, Shower Head: 100, 100, 100 [deg C.]
Pressure: 88-110 [Pa]
Gap Length: 25 [mm]
145 nm Target: 2140 [cycle]
Source Bottle, Feeding Line: 35, 45 deg C.

Note that in the table, "BTL-Ar" (slpm) indicates the flow rate of precursor gas (carrier gas is Ar), while "APR-Ar" (kPa) indicates the pressure of carrier gas at the auto pressure regulator (for the purpose of flow rate control).

Figure 5:
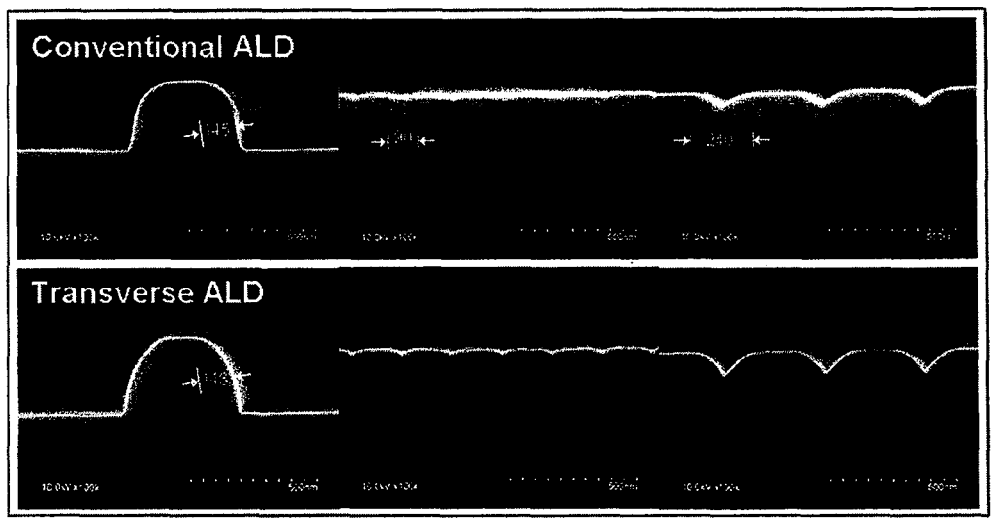
FIG. 5 shows cross sectional SEM photographs of substrates after the gap fill process according to conventional ALD and transverse ALD (at 100° C.) according to an embodiment of the present invention.

A comparison of SEM photographs of the cross-sections of patterns on which film was formed under the aforementioned conditions is shown in FIG. 5. As shown, forming a film of 145 nm in thickness on side walls by means of conventional ALD (photograph on top) made the areas of 100-nm openings and 240-nm trenches virtually flat, but a film of 145 nm in thickness was also formed in a longitudinal direction from the openings. On the other hand, forming a film of 145 nm in thickness on side walls by means of transverse ALD (photograph at bottom) reduced the film thickness by 62 nm from the openings of trenches in a longitudinal direction, while also burying the trenches of 240-nm openings completely until the opening. These results clearly indicate an ample possibility that CMP or dry etching could be reduced or eliminated after gap filling.

Figure 6:
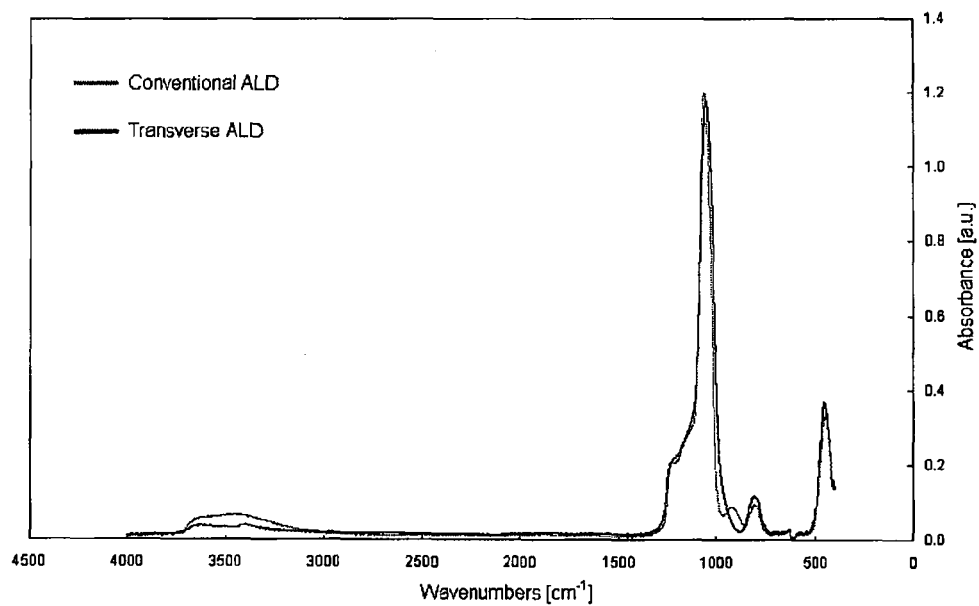
FIG. 6 shows normalized FT-IR spectrum of conventional ALD and transverse ALD (at 100° C.) according to an embodiment of the present invention.

Since transverse ALD uses plasma of a gas containing N atoms in the SiO film formation process, nitriding of oxide film was of concern. Accordingly, FT-IR spectral measurement was conducted with a sample film formed to a thickness of 110 to 120 nm under the gap filling trial conditions and the results were compared against a film-standardized FT-IR spectrum. However, conversion of oxide film to SiN did not occur as a result of irradiation of $NH_3$ plasma (FIG. 6). Also note that, while the film formed in a longitudinal direction by means of transverse ALD exhibited a refractive index of 1.47 to 1.50 at a wavelength of 633 nm, the refractive index improved to 1.46 as a result of annealing at 800° C. This is a clear evidence that virtually no nitriding occurred in a longitudinal direction and that a complete SiO film could be obtained with annealing.

2) Side Wall Spacer

Side wall spacer films were formed in an ALD chamber maintained at 400° C. to minimize physisorption. Transverse ALD was implemented by irradiating oxygen plasma of 400 W in RF power for 0.4 second to the material adsorbed onto the substrate, and then irradiating $NH_3$ plasma of 800 W in RF power for 0.8 second. In conventional ALD, the process after oxygen plasma irradiation was skipped. The reference film formation conditions of conventional ALD are shown in Table 7, while the film formation conditions of transverse ALD are shown in Table 8. Film formation cycles were fixed to 1,250 cycles in both cases.

TABLE 7

| Step | Time [sec] | RF-Power [W] | NH3 [slpm] | O2 [sccm] | BTL-Ar [slpm] | APR-Ar [kPa] | Seal He [sccm] |
|---|---|---|---|---|---|---|---|
| Precursor Pulse | 1.0 | | | | 2 (1.3) | 55 | |
| Precursor Purge | 0.3 | | | 400 | | | |
| RF Pulse | 0.4 | 400 | | | | | |
| RF Purge | 0.3 | | | | | | 200 |

Ssceptor, Wall, Shower Head: 400, 130, 150 [deg C.]
Pressure: 77-144 [Pa]
Gap Length: 15 [mm]
Source Bottle, Feed Line: Room Temperature

TABLE 8

| Step | Time [sec] | RF-Power [W] | NH3 [slpm] | O2 [sccm] | BTL-Ar [slpm] | APR-Ar [kPa] | Seal He [sccm] |
|---|---|---|---|---|---|---|---|
| Precursor Pulse | 1.0 | | | | 2 (1.3) | 55 | |
| Precursor Purge | 0.3 | | | 400 | | | |
| RF Pulse | 0.4 | 400 | | | | | |
| RF Purge | 0.3 | | | | | | 200 |
| Change | 2.0 | | | | | | |
| RF Pulse | 0.8 | 800 | 1.2 | | | | |
| RF Purge | 0.3 | | | | | | |

Figure 7:
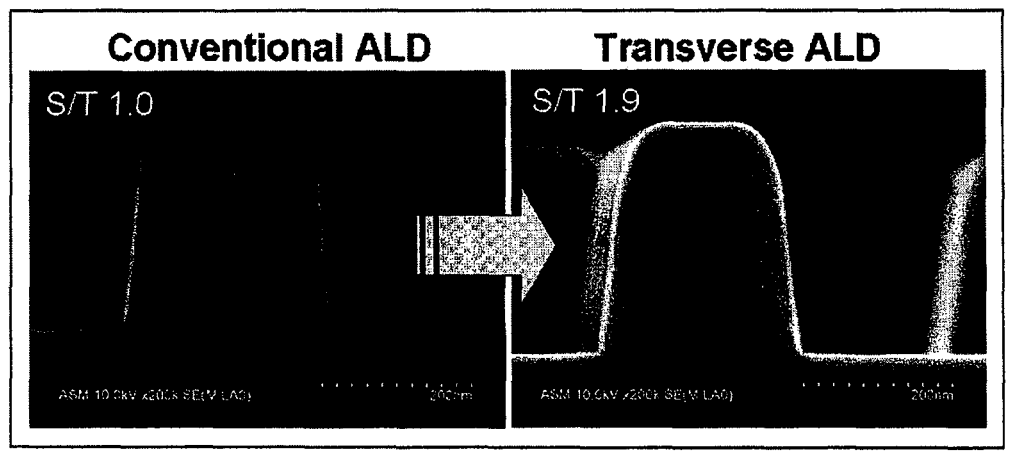
FIG. 7 shows cross sectional SEM photographs of substrates after the side wall spacer formation process according to conventional ALD and transverse ALD (at 400° C.) according to an embodiment of the present invention.

Ssceptor, Wall, Shower Head: 400, 130, 150 [deg C.]
Pressure: 113-147 [Pa]
Gap Length: 15 [mm]
Source Bottle, Feed Line: Room Temperature A comparison of SEM photographs of the cross-sections of patterns on which film was formed under the aforementioned conditions is shown in FIG. 7. The degree of specialization of the film growth in a transverse direction is indicated as the ratio of the film thickness on the side face of the pattern (side) relative to that of the pattern at the top (top). In other words, a S/T ratio of greater than 1.0 indicates specialization of the film growth in a transverse direction. The sample of transverse ALD where the film was formed under the conditions shown in Table 8 had a S/T ratio of 1.9, compared to the sample of conventional ALD having a S/T ratio of 1.0, indicating specialization of the film growth in a transverse direction.

Figure 8:
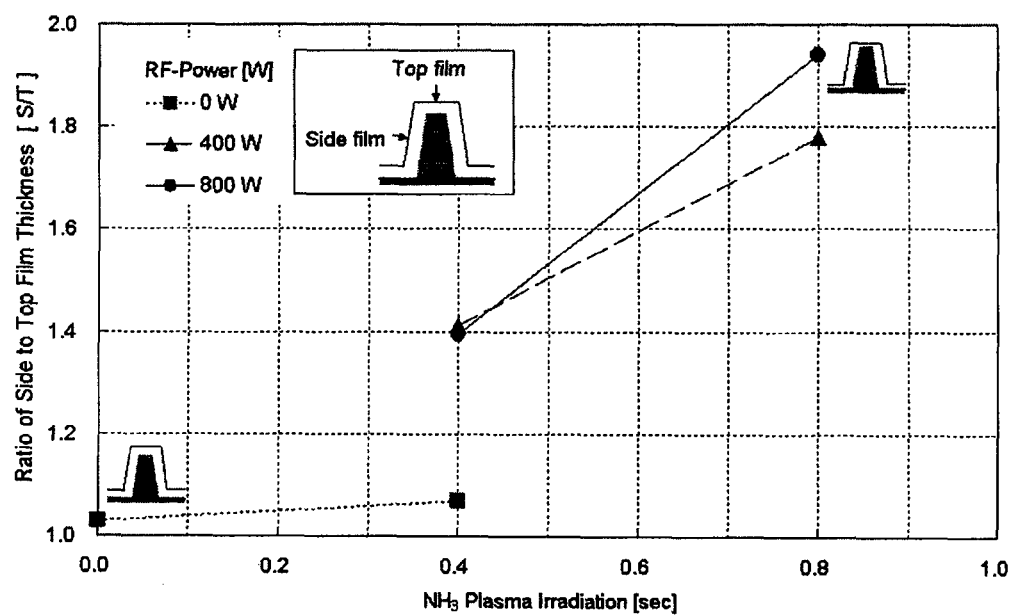
FIG. 8 is a graph illustrating the relationship between the ratio of side to top film thickness (S/T) and the duration of NH3 plasma irradiation (sec) as a function of RF power (W) according to some embodiments of the present invention.

To control this degree of specialization of the film growth in a transverse direction, the relationship between the S/T ratio on one hand, and the RF application time (inhibition cycle) during which to generate $NH_3$ plasma on the other, was examined by changing the RF power (FIG. 8). In this experiment, film formation cycles were also fixed to 1,250 cycles.

When the process specific to transverse ALD was applied to conventional ALD with a S/T ratio of 1.0, increasing the application time at an RF power of 0 W (in other words, supplying $NH_3$ for a specified period without applying RF power) caused the S/T ratio to increase slightly. This means that as $NH_3$ came in contact with and was chemisorbed onto the oxide film on top of the pattern, chemisorption of the material on top of the pattern was suppressed.

Comparison among the S/T ratios achieved at different RF powers and RF application time of 0.4 second shows that the S/T ratio was approximately 1.1 when the RF power was turned on, or at 0 W, and it became 1.4 or so when the RF power was 400 W and 800 W. These figures indicate that specialization of the film growth in a transverse direction could be achieved as long as the RF power is at a certain level.

While the S/T ratio was the same at an RF application time of 0.4 second regardless of whether the RF power was 400 W or 800 W, high degrees of specialization to a transverse direction were exhibited at both power levels as indicated by a S/T ratio of 1.8 at the RF power of 400 W and 1.9 at the RF power of 800 W. These results clearly show that the degree of specialization of the film growth in a transverse direction would increase when a high RF power is applied for a long period of time.

It is also clear that, in the case of PR or other samples vulnerable to RF damage, applying a low RF power for a long period of time would achieve specialization of the film growth in a transverse direction while also reducing damage.

3) SDDP

The demonstration experiment of SDDP was conducted using a CVD chamber where the material supply line and material bottle were kept to normal temperature. For the samples, 100° C. was selected as the film formation temperature in view of the heat resistance of photoresist (PR). Also, oxygen plasma was generated at an RF power of 40 W to reduce the plasma damage to be suffered by PR during the formation of oxide film, while the RF application time was set to 1.0 second to ensure that the material would be oxidized. When the film formation temperature is 100° C., the impact of physisorption increases and the effect of inhibiting chemisorption decreases. Accordingly, $NH_3$ plasma of greater RF power must be irradiated onto the oxide film over a longer period of time.

Since the purpose of this experiment was to clearly show the effectiveness of transverse ALD, $NH_3$ plasma was irradiated for 1.0 second at an RF power of 400 W after the formation of oxide film. Note that film formation cycles were fixed to 1,400 cycles. The film formation conditions of conventional ALD are shown in Table 9, while the film formation conditions of transverse ALD are shown in Table 10.

TABLE 9

| Step | Time [sec] | RF-Power [W] | NH3 [slpm] | O2 [sccm] | BTL-Ar [slpm] | APR-Ar [kPa] | Ar [sccm] | Seal He [sccm] |
|---|---|---|---|---|---|---|---|---|
| Precursor Pulse | 1.0 | | | | 2 | 30 | | |
| Precursor Purge | 0.3 | | | 400 | | | 200 | 200 |
| RF Pulse | 1.0 | 40 | | | | | | |
| RF Purge | 0.5 | | | | | | | |

Susceptor, Wall, Shower Head: 100, 100, 100 [deg C.]
Pressure: 84-115 [Pa]
Gap Length: 25 [mm]
Source Bottle, Feed Line: Room Temperature

TABLE 10

| Step | Time [sec] | RF-Power [W] | NH3 [slpm] | O2 [sccm] | BTL-Ar [slpm] | APR-Ar [kPa] | Ar [sccm] | Seal He [sccm] |
|---|---|---|---|---|---|---|---|---|
| Precursor Pulse | 1.0 | | | | 2 | 30 | | |
| Precursor Purge | 0.3 | | | 400 | | | | |
| RF Pulse | 1.0 | 40 | | | | | | |
| RF Purge | 0.5 | | | | | | 200 | 200 |
| Change | 3.0 | | 2 | | | | | |
| RF Pulse | 1.0 | 400 | | | | | | |
| RF Purge | 1.0 | | | 400 | | | | |

Figure 9:
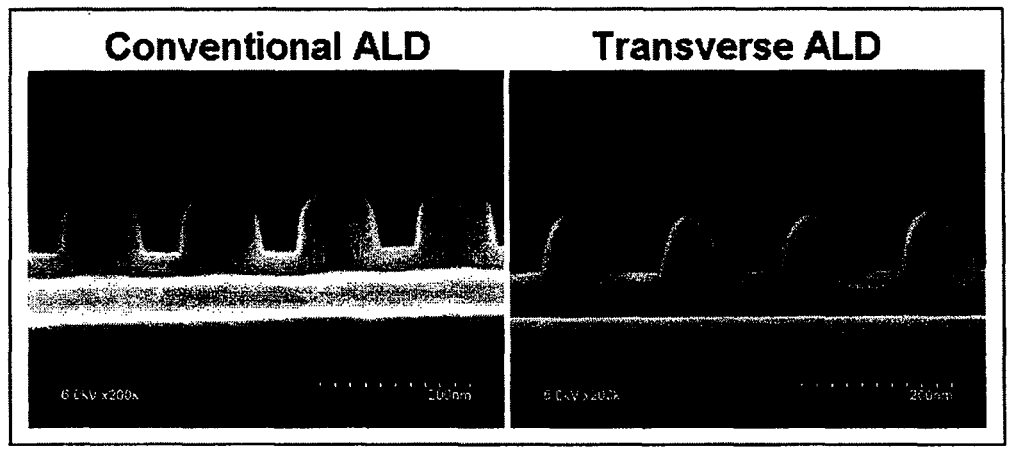
FIG. 9 shows cross sectional SEM photographs of substrates after the SDDP process according to conventional ALD and transverse ALD (at 100° C.) according to an embodiment of the present invention.

Susceptor, Wall, Shower Head: 100, 100, 100 [deg C.]
Pressure: 85-115 [Pa]
Gap Length: 25 [mm]
Source Bottle, Feed Line: Room Temperature SEM photographs of the cross-sections of PR patterns are shown in FIG. 9. The samples observed by a SEM were formed with a longer platinum coating time to prevent the coverage shape from changing due to the electron beam during observation, and therefore PR disappeared during the sample production process. As for the PR pattern uniformly covered by means of conventional ALD, the specialization of the film growth in a transverse direction improved to a S/T ratio of 1.55 when transverse ALD was applied. This clearly shows that transverse ALD would also be applicable to SDDP.

It should be noted that, in this experiment, the PR pattern width decreased by 15 to 20% when transverse ALD was applied. From the results shown in FIG. 8, however, it would be possible to achieve specialization of the film growth in a transverse direction while reducing damage to PR further, if a low RF power is applied over a longer period of time.

4) Other

The following discusses the added values of transverse ALD that were revealed by wet etching using 1% hydrogen fluoride.

a) Improvement of Wet Etching Resistance

Films were formed over silicon patterns in an ALD chamber kept to 100° C. At this time, the material supply line and material bottle were used at normal temperature. Conventional ALD was implemented by applying oxygen plasma, generated at an RF power of 40 W, for 0.4 second to the material adsorbed onto the substrate. Under transverse ALD, specialization of the film growth in a transverse direction was achieved by applying $NH_3$ plasma, generated at an RF power of 400 W, for 0.8 second in each oxide film formation process. The film formation conditions of conventional ALD are shown in Table 11, while the film formation conditions of transverse ALD are shown in Table 12. Film formation cycles over the silicon pattern were fixed to 1,250 cycles under both sets of conditions.

TABLE 11

| Step | Time [sec] | RF-Power [W] | NH3 [slpm] | O2 [sccm] | BTL-Ar [slpm] | APR-Ar [kPa] | Seal He [sccm] |
|---|---|---|---|---|---|---|---|
| Precursor Pulse | 1.0 | | | | 2 (1.3) | 55 | |
| Precursor Purge | 0.3 | | | 400 | | | |
| RF Pulse | 0.4 | 40 | | | | | |
| RF Purge | 0.3 | | | | | | 200 |

Ssceptor, Wall, Shower Head: 100, 60, 75 [deg C.]
Pressure: 128-142 [Pa]
Gap Length: 15 [mm]
Source Bottle, Feed Line: Room Temperature

TABLE 12

| Step | Time [sec] | RF-Power [W] | NH3 [slpm] | O2 [sccm] | BTL-Ar [slpm] | APR-Ar [kPa] | Seal He [sccm] |
|---|---|---|---|---|---|---|---|
| Precursor Pulse | 1.0 | | | | 2 (1.3) | 55 | |
| Precursor Purge | 0.3 | | | 400 | | | |
| RF Pulse | 0.4 | 40 | | | | | |
| RF Purge | 0.3 | | | | | | 200 |
| Change | 2.0 | | | | | | |
| RF Pulse | 0.8 | 400 | 2 | | | | |
| RF Purge | 0.3 | | | | | | |

Figure 10:
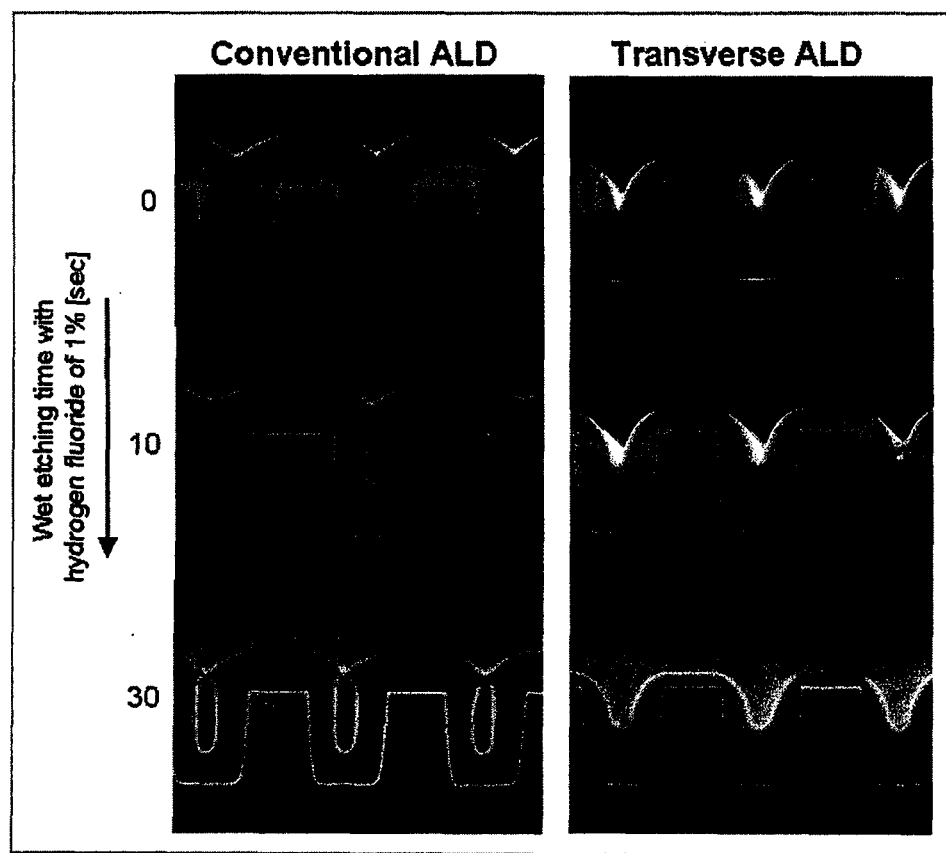
FIG. 10 shows cross sectional SEM photographs of substrates after the wet etching process according to conventional ALD and transverse ALD according to an embodiment of the present invention.

Ssceptor, Wall, Shower Head: 100, 60, 75 [deg C.]
Pressure: 108-155 [Pa]
Gap Length: 15 [mm]
Source Bottle, Feed Line: Room Temperature Evaluation samples of wet etching resistance were prepared by soaking in an aqueous hydrogen fluoride solution adjusted to 1% (for 0, 10 and 30 seconds) the cross-sections of patterns on which film had been formed. SEM photographs of the cross-sections of trenches having an opening of 240 nm are shown in FIG. 10. Clearly the oxide film formed by means of conventional ALD suffered erosion from the seams after a soak time of 10 seconds. At a soak time of 30 seconds, it is also clear that the interface between the silicon substrate and oxide film was eroded. On the other hand, the oxide film formed by means of transverse ALD did not expose the seams after a soak time of 10 seconds, and the interface between the silicon substrate and oxide film was not eroded after 30 seconds of soak time. Note that the adhesion of seams was better with transverse ALD compared to conventional ALD. This is probably because the corners of trench openings were rounded by irradiation of $NH_3$ plasma, which in turn made it easy for oxygen radical species to enter the seams, resulting in better adhesion. In addition, the adhesion with the Si substrate was also better with transverse ALD compared to conventional ALD. This is probably because weak bonds were eliminated in transverse ALD due to the growth suppression effect or ion bombardment.

The above indicates that the application of transverse ALD is also effective in improving the trench burying characteristics, as well as adhesion between the silicon substrate and oxide film.

b) Uniform Film Quality

Figure 11:
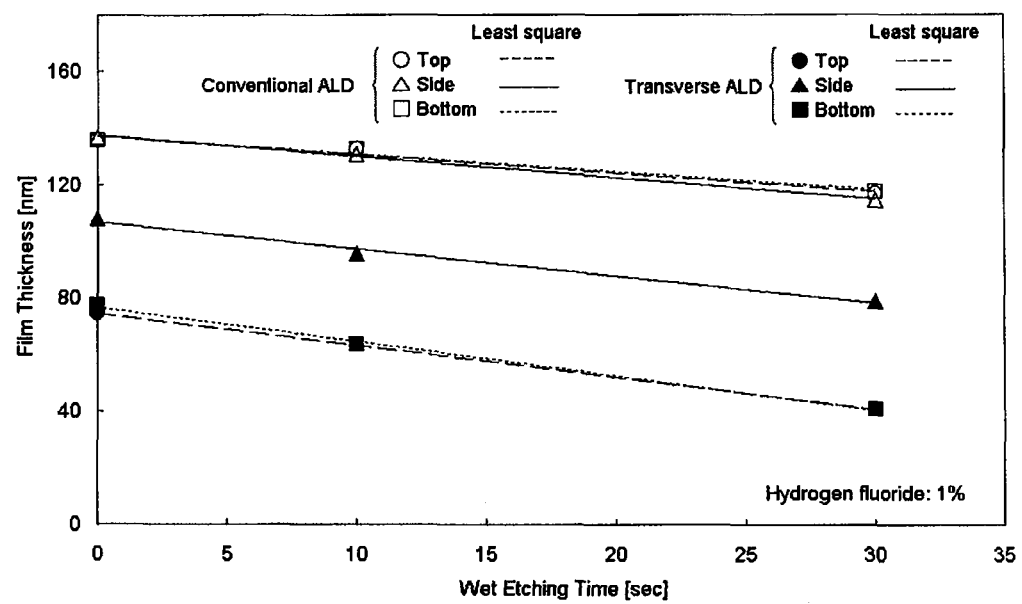
FIG. 11 is a graph illustrating the relationship between the film thickness (nm) and the wet etching time (sec) as a function of the geometrical locations of the films according to conventional ALD and transverse ALD according to an embodiment of the present invention.

In the evaluation of film quality, films were formed on silicon patterns by means of conventional ALD and transverse ALD, SEM observation samples were created, and wet etching was performed, all in the same manners as in a). The film quality was evaluated by measuring the film thickness at different parts of the silicon pattern (top, side and bottom) after each of the specified soak times (0, 10 and 30 seconds) and then plotting the results in a graph. FIG. 11 shows how the film thickness at each part changed relative to the soak time.

In the graph, the outline-only symbols indicate samples subjected to film formation under conventional ALD, while the filled symbols indicate samples subjected to the film formation under transverse ALD. Different symbol shapes indicate different parts of the pattern: the circle represents the top; the triangle represents the side; and the square represents the bottom.

When the change in the film thickness of the conventional ALD sample as measured by wet etching was plotted for each part and the results were linearly approximated based on the least square method, the approximation lines representing the thickness changes at the top, side and bottom roughly corresponded to one another. Accordingly, it is clear that the sample subjected to film formation under conventional ALD had roughly equivalent film quality at the top, side and bottom.

When the change in the film thickness of the transverse ALD sample was plotted in a graph and linearly approximated based on the least square method in the same manner, the approximation lines representing the thickness changes at the top and bottom roughly corresponded to each another. This reveals that this sample had roughly equivalent film quality at the top and bottom. Further, when these approximation lines are compared against the approximation line for the side, they are running nearly in parallel. From this, the wet etching rates at the respective parts are equivalent. In other words, the sample subjected to the film formation under transverse ALD also had roughly equivalent film quality at the top, side and bottom.

Since the film was formed on the samples for a fixed number of 1,250 cycles, a difference in film thickness is observed at a soak time of 0 seconds. In transverse ALD where inhibition of chemisorption is utilized, the direction of inhibition is not perfectly controlled and therefore a slight inhibition occurs in a transverse direction, although not as much as in a longitudinal direction. This is why the film growth was not as much as that in a transverse direction under transverse ALD compared to conventional ALD. Further, the reduction in film thickness in a longitudinal direction is a unique characteristic of transverse ALD.

All approximation lines shown in FIG. 11, clearly, are running in parallel with one another. Parallel approximation lines mean that the film in each part has virtually the same solubility in 1% aqueous hydrogen fluoride solution. In this sense, the results of this experiment provide powerful evidence proving that each part has uniform film quality. It is also clear that transverse ALD does not negatively affect the resistance to 1% aqueous hydrogen fluoride solution.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming a film on a substrate by atomic layer deposition wherein vertical growth of a film is selectively inhibited more than horizontal growth of the film, said vertical growth being defined as growth in a gravitational direction, said horizontal growth being defined as growth in a direction perpendicular to the gravitational direction, comprising:

(i) adsorbing a metal-containing precursor for film formation on a concave or convex surface pattern of a substrate;
(ii) oxidizing the adsorbed precursor to form a metal oxide sub-layer;
(iii) adsorbing a metal-free inhibitor on the metal oxide sub-layer more on a top and bottom portion than on side walls of the concave or convex surface pattern, said adsorption of the inhibitor being antagonistic to the next adsorption of the precursor on the metal oxide sub-layer; and
(iv) repeating steps (i) to (iii) to form a film constituted by multiple metal oxide sub-layers while selectively inhibiting vertical growth of the film by step (iii) more than horizontal growth of the film,
wherein the metal-free inhibitor comprises nitrogen and hydrogen, and
wherein step (iii) comprises supplying a metal-free inhibitor gas over the substrate without supplying the metal-containing precursor, and applying RF power to the inhibitor gas to generate radicals therefrom which deposit more in a vertical direction than in a horizontal direction, thereby adsorbing the inhibitor on the metal oxide sub-layer more on a top and bottom portion than on side walls.

2. The method according to claim 1, wherein the vertical growth of the film is substantially less than the horizontal growth of the film.

3. The method according to claim 1, wherein the metal-containing precursor comprises silicon, nitrogen, hydrogen, and carbon.

4. The method according to claim 2, wherein the metal-containing precursor is a silicon-containing amine.

5. The method according to claim 2, wherein the metal oxide sub-layer is constituted by SiO or SiOC.

6. The method according to claim 1, wherein the metal-free inhibitor is ammonia or pyridine.

7. The method according to claim 1, wherein step (ii) comprises supplying oxygen over the substrate, and applying RF power to the oxygen to generate an oxygen plasma, thereby oxidizing the adsorbed precursor.

8. The method according to claim 1, wherein the film has a conformality of 120% or higher, said conformality being defined as a ratio of film thickness on the side walls and film thickness on the top portion.

9. A method for forming a film on a substrate by atomic layer deposition wherein vertical growth of a film is selectively inhibited more than horizontal growth of the film, said vertical growth being defined as growth in a gravitational direction, said horizontal growth being defined as growth in a direction perpendicular to the gravitational direction, comprising:
(i) adsorbing a metal-containing precursor for film formation on a concave or convex surface pattern of a substrate;
(ii) oxidizing the adsorbed precursor to form a metal oxide sub-layer;
(iii) adsorbing a metal-free inhibitor on the metal oxide sub-layer more on a top and bottom portion than on side walls of the concave or convex surface pattern, said adsorption of the inhibitor being antagonistic to the next adsorption of the precursor on the metal oxide sub-layer; and
(iv) repeating steps (i) to (iii) to form a film constituted by multiple metal oxide sub-layers while selectively inhibiting vertical growth of the film by step (iii) more than horizontal growth of the film,
wherein step (ii) comprises supplying oxygen over the substrate, and applying RF power to the oxygen to generate an oxygen plasma, thereby oxidizing the adsorbed precursor, and step (iii) comprises supplying a metal-free inhibitor gas over the substrate, and applying RF power to the inhibitor gas to generate radicals therefrom, thereby adsorbing the inhibitor on the metal oxide sub-layer, wherein the RF power in step (iii) is greater than the RF power in step (ii).

10. The method according to claim 1, wherein in step (iii), a reverse bias or low frequency waves is/are applied on the substrate to direct the movement of radicals more in a vertical direction than in a horizontal direction.

11. A method for forming a film on a substrate by atomic layer deposition wherein vertical growth of a film is selectively inhibited more than horizontal growth of the film, said vertical growth being defined as growth in a gravitation direction, said horizontal growth being defined as growth in a direction perpendicular to the gravitational direction, comprising:
(i) adsorbing a metal-containing precursor for film formation on a concave or convex surface pattern of a substrate;
(ii) oxidizing the adsorbed precursor to form a metal oxide sub-layer;
(iii) adsorbing a metal-free inhibitor on the metal oxide sub-layer more on a top and bottom portion than on side walls of the concave or convex surface pattern, said adsorption of the inhibitor being antagonistic to the next adsorption of the precursor on the metal oxide sub-layer; and
(iv) repeating steps (i) to (iii) to form a film constituted by multiple metal oxide sub-layers while selectively inhibiting vertical growth of the film by step (iii) more than horizontal growth of the film,
wherein step (i) comprises supplying a metal-containing precursor gas over the substrate in a pulse of about 0.1 to about 3.0 seconds, step (ii) comprises applying RF power in the presence of oxygen over the substrate in a pulse of about 0.1 to about 5.0 seconds, and step (iii) comprises supplying a metal-free inhibitor over the substrate in a pulse of about 2 to about 2.5 seconds with RF power application in a pulse of about 0.1 to about 5.0 seconds, wherein steps (i) to (iii) are separated by purging.

12. The method according to claim 1, wherein the concave or convex surface pattern is constituted by trenches.

* * * * *